United States Patent [19]

Bennett et al.

[11] Patent Number: 4,722,026
[45] Date of Patent: Jan. 26, 1988

[54] THERMAL PROTECTION APPARATUS

[75] Inventors: Gloria A. Bennett; Troy K. Moore, both of Los Alamos, N. Mex.

[73] Assignee: The United States of America as represented by the United States Department of Energy, Washington, D.C.

[21] Appl. No.: 898,083

[22] Filed: Aug. 20, 1986

[51] Int. Cl.$^4$ .............................................. H05K 7/20
[52] U.S. Cl. ................................. 361/380; 361/381; 174/52 S; 62/437; 165/902
[58] Field of Search .......................... 361/380–389, 361/395, 331, 392, 417, 419; 174/15 HP, 52 S, 52 R; 62/437, 514 R; 165/DIG. 4, 902

[56] References Cited

U.S. PATENT DOCUMENTS

| | | | |
|---|---|---|---|
| 3,105,148 | 9/1963 | Monaghan | 165/902 |
| 3,265,893 | 8/1966 | Rabson | 165/902 |
| 3,859,574 | 1/1975 | Brazier | 174/52 S |
| 4,513,352 | 4/1985 | Bennett | 361/385 |

Primary Examiner—G. P. Tolin
Attorney, Agent, or Firm—Samuel M. Freund; Paul D. Gaetjens; Judson R. Hightower

[57] ABSTRACT

An apparatus for thermally protecting heat sensitive components of tools. The apparatus comprises a Dewar for holding the heat sensitive components. The Dewar has spaced-apart inside and outside walls, an open top end and a bottom end. An insulating plug is located in the top end. The inside wall has portions defining an inside wall aperture located at the bottom of the Dewar and the outside wall has portions defining an outside wall aperture located at the bottom of the Dewar. A bottom connector has inside and outside components. The inside component sealably engages the inside wall aperture and the outside component sealably engages the outside wall aperture. The inside component is operatively connected to the heat sensitive components and to the outside component. The connections can be made with optical fibers or with electrically conducting wires.

17 Claims, 3 Drawing Figures

THERMAL PROTECTION APPARATUS

This invention is the result of a contract with the Department of Energy (Contract No. W-7405-ENG-36).

BACKGROUND OF THE INVENTION

The invention described herein relates generally to thermal protection structures for downhole tools and, more particularly, to improved thermal protection structures for heat sensitive downhole electronics used in making geotechnical measurements.

Known devices for thermally protecting electronic components in downhole tools use a Dewar, a double-walled vessel with a removable plug located in one end. A housing surrounds and protects the Dewar and components from the high pressures encountered in geothermal and oil well boreholes. One such device is described in U.S. Pat. No. 4,513,352, "Thermal Protection Apparatus," to G. Bennett et al. Bennett et al. use heat pipes to efficiently conduct heat from heat sensitive components to a heat sink, such as ice, located in a Dewar.

In the Bennett et al. and other known thermal protection devices, a cable having electrical conductors is used to provide the device with power and to carry data signals. The cable can include optical fibers. In known devices, there is an opening in the plug to allow the cable to reach the components protected by the Dewar. The plug and the opening create a significant thermal leak. It is therefore desirable to construct a thermal protection apparatus which reduces thermal losses and which allows electrical communication with the components in a Dewar. Moreover, contact with sensing elements outside of the Dewar and on the opposite side thereof from the downhole cable is made with cabling which passes outside of the Dewar thereby creating a bulky exterior. A more direct electrical and optical fiber connection would be most desirable.

SUMMARY OF THE INVENTION

One object of the present invention is to provide an improved thermal protection apparatus for heat sensitive components of tools used in making downhole geotechnical measurements.

Another object of the invention is to permit electrical and optical communication with components in a Dewar while improving the thermal protection provided by the Dewar.

Still another object of the invention is to provide an improved electrical and optical connection between the heat sensitive components inside a Dewar and a thermally hardened sensor outside of the Dewar.

To achieve the foregoing and other objects, and in accordance with the purposes of the present invention, as embodied and broadly described herein, there is provided an apparatus for thermally protecting heat sensitive components of tools. The apparatus comprises a Dewar for holding the heat sensitive components. The Dewar has an open top end, a bottom end, an inside wall and an outside wall. A plug is located in the top end of the Dewar. The inside wall is spaced apart from the outside wall. The inside wall has portions defining an inside wall aperture located at the bottom end of the Dewar and the outside wall has portions defining an outside wall aperture located at the bottom end of the Dewar. A bottom connector has inside and outside components. The inside component sealably engages the inside wall aperture and the outside component sealably engages the outside wall aperture. The inside component is connected to the outside component and to the heat sensitive components.

In another embodiment of the invention, the apparatus for thermally protecting heat sensitive components of tools comprises a Dewar for holding the heat sensitive components. The Dewar has an open top end, a bottom end, an inside wall and an outside wall. The inside wall is spaced apart from the outside wall. An evacuated chamber is disposed in the top end. The chamber has a top wall, a bottom wall and a side wall. The side wall sealably engages the inside wall of the Dewar. The chamber is removably connected to the Dewar. The top wall has portions defining a top wall aperture and the bottom wall has portions defining a bottom wall aperture. A top connector has first and second components. The first component sealably engages the top wall aperture and the second component sealably engages the bottom wall aperture. The second component is connected to the first component and to the heat sensitive components.

One advantage of the present invention is that it provides better thermal protection for heat sensitive components than known devices.

Another advantage of the invention is that the proper electrical operation of electrical components in the Dewar can be verified without disassembling the apparatus.

Yet another advantage of the invention is that heat sensitive components inside the Dewar are more directly connected to thermally hardened sensors located outside of the Dewar.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate several embodiments of the present invention and, together with the description, serve to explain the principles of the invention. In the drawings.

DETAILED DESCRIPTION OF THE INVENTION

Figure 1:
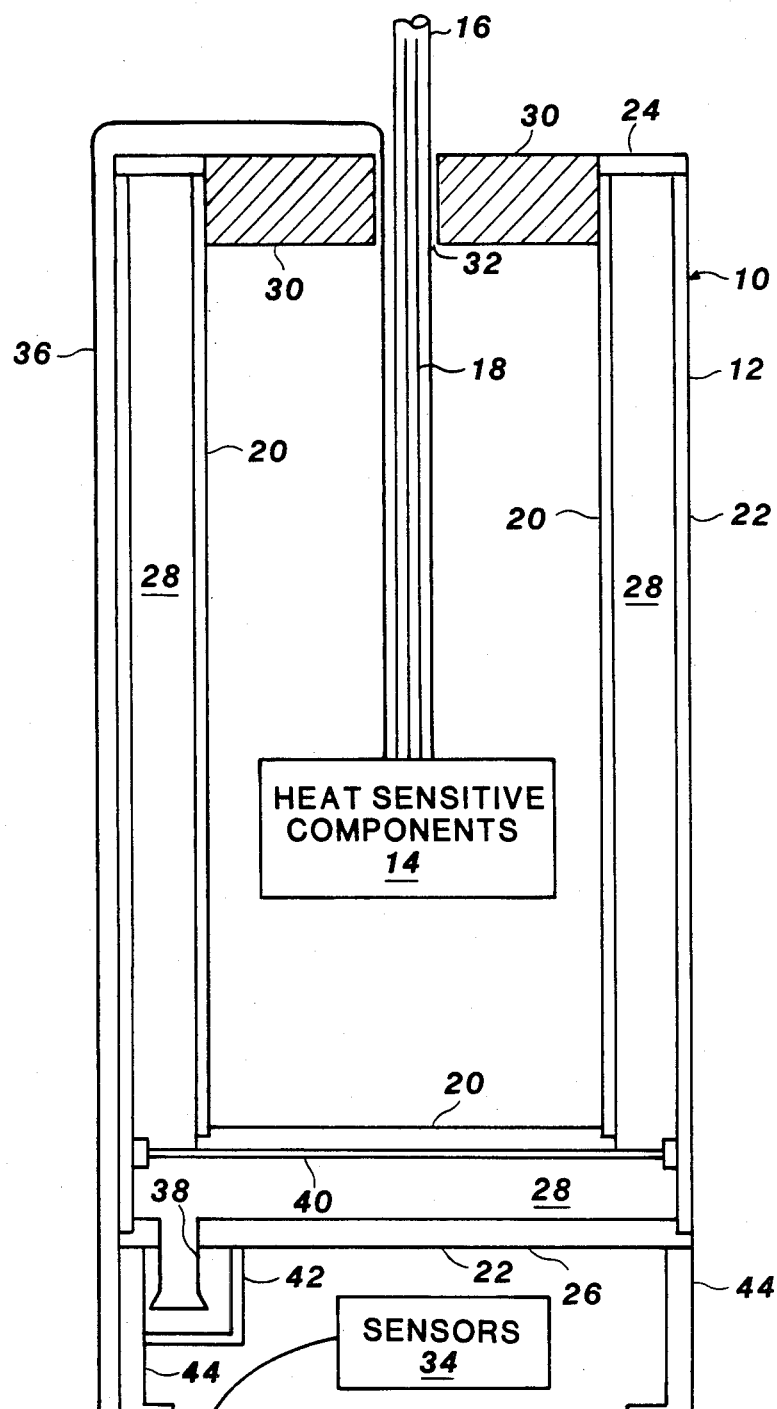
FIG. 1 shows a cross-sectional view of a known thermal protection device.

Reference is now made to FIG. 1 which shows a cross-sectional view of a known thermal protection device 10. The device 10 comprises a Dewar 12 holding heat sensitive components 14. The device 10 is lowered into a geothermal borehole by a cable 16. Cable 16 includes wires 18 which are connected to heat sensitive components 14. Dewar 12 has an inside wall 20 and an outside wall 22 spaced apart therefrom. Dewar 12 includes a top end 24 and a bottom end 26. The region 28 between inside wall 20 and outside wall 22 is evacuated. A plug 30 is located in the top end 24 of Dewar 12. Plug 30 can be made of cork or other insulating materials. There is an opening 32 in plug 30 through which cable 16 passes.

Thermally hardened sensors 34 are connected to heat sensitive components 14 by a transmission link 36 which runs along the outside of Dewar 12, passing through opening 32. Transmission link 36 can include electrical and optical elements. This conventional arrangement is an inconvenient way to route the transmission link 36 and increases the distance between the thermally hardened sensors 34 and the supporting electronics in the heat sensitive components 14. The increased distance may be detrimental to the signals being processed. Thermally hardened sensors 34 can be mechanically connected to other downhole tools (not shown) located beneath the bottom end 26 of Dewar 12. Examples of thermally hardened sensors 34 are pressure and temperature-sensing devices. Thermally hardened sensors 34 do not need protection from the high pressures and temperatures encountered in boreholes.

A first pinch-off tube 38 permits evacuation of region 28. A support 40 supports inside wall 20. A first protector 42 and a second protector 44 protect first pinch-off tube 38.

Figure 2:
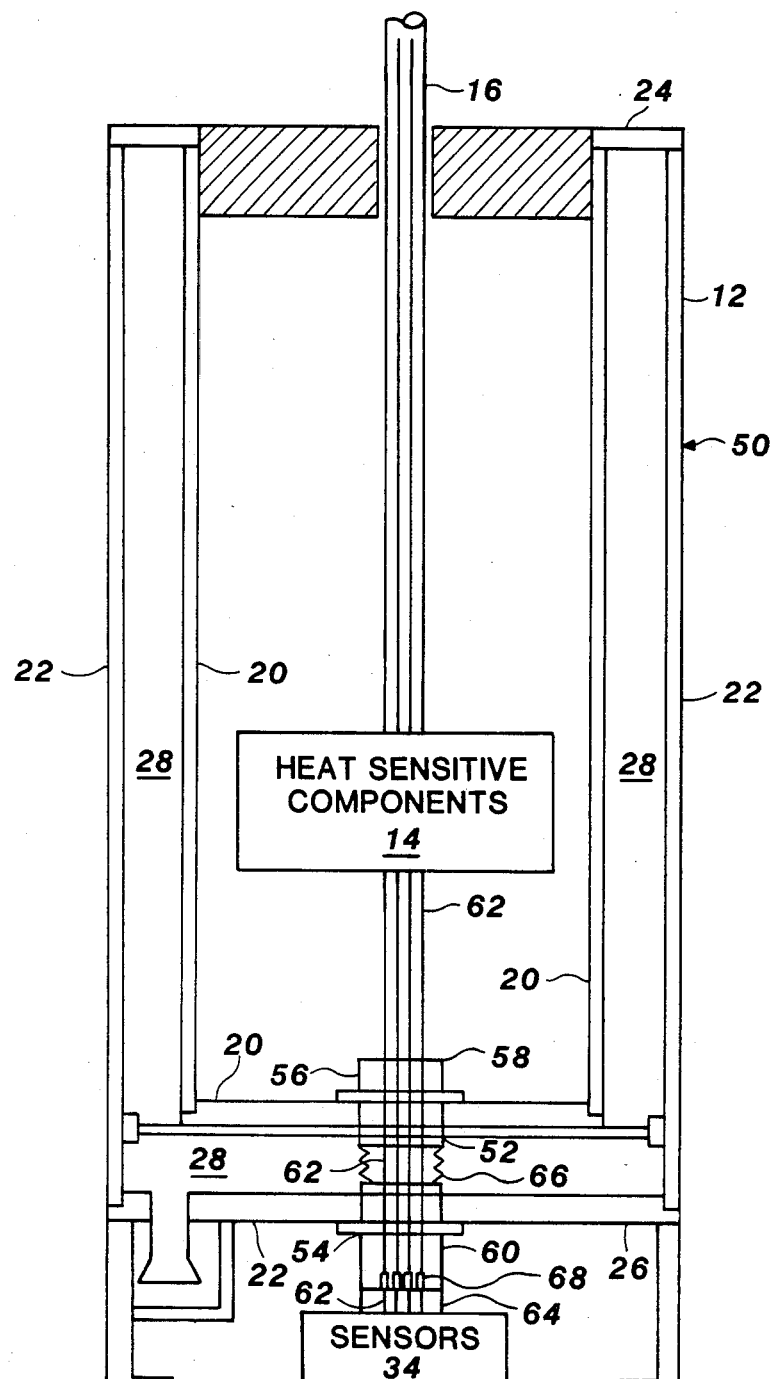
FIG. 2 shows a cross-sectional view of an embodiment of the invention which has a vacuum-tight connection between heat sensitive components inside the Dewar and thermally hardened sensors outside the Dewar and a plug in the open end thereof for providing additional thermal insulation to the heat sensitive components.

Reference is now made to FIG. 2 which shows a cross-sectional view of an embodiment of the present invention, which is an apparatus 50 for thermally protecting heat sensitive components 14 of tools. The apparatus 50 is movable in and out of geothermal boreholes or other high temperature or pressure environments using cable 16. Apparatus 50 comprises a Dewar 12 holding the heat sensitive components 14. Dewar 12 has a top end 24, a bottom end 26, an inside wall 20 and an outside wall 22 spaced apart from inside wall 20. The region 28 between inside wall 20 and outside wall 22 is evacuated.

Inside wall 20 has portions defining an inside wall aperture 52 located at bottom end 26 of Dewar 12. Outside wall 22 has portions defining an outisde wall aperture 54 located at bottom end 26. A bottom connector 56 has an inside component 58 and an outside component 60. Inside component 58 sealably engages inside wall aperture 52 and outside component 60 sealably engages outside wall aperture 54. Inside component 58 is connected by conduction elements 62 to heat sensitive components 14 and to outside component 60. Outside component 60 is connected by conduction elements 62, which pass through an electrical connector 64, to thermally hardened sensors 34. Conduction elements 62 can be optical fibers or electrically conducting wires. A bellows 66 can surround the portions of conduction elements 62 which connect inside component 58 to outside component 60. If a bellows 66 is used, outside component 60 need not have a vacuum-tight connection between contacts 68 and conduction elements 62. Pins, not shown, could be used in place of sockets 68. Inside component 58 need not have a vacuum-tight connection to conduction elements 62 if a bellows 66 is used. If a bellows 66 is not used, these connections must be vacuum tight. Conduction elements 62 can be coated with insulating materials to prevent arcing. Bellows 66 is not necessary if conduction elements 62 are coated with high vacuum insulating materials and vacuum tight connections are employed.

Figure 3:
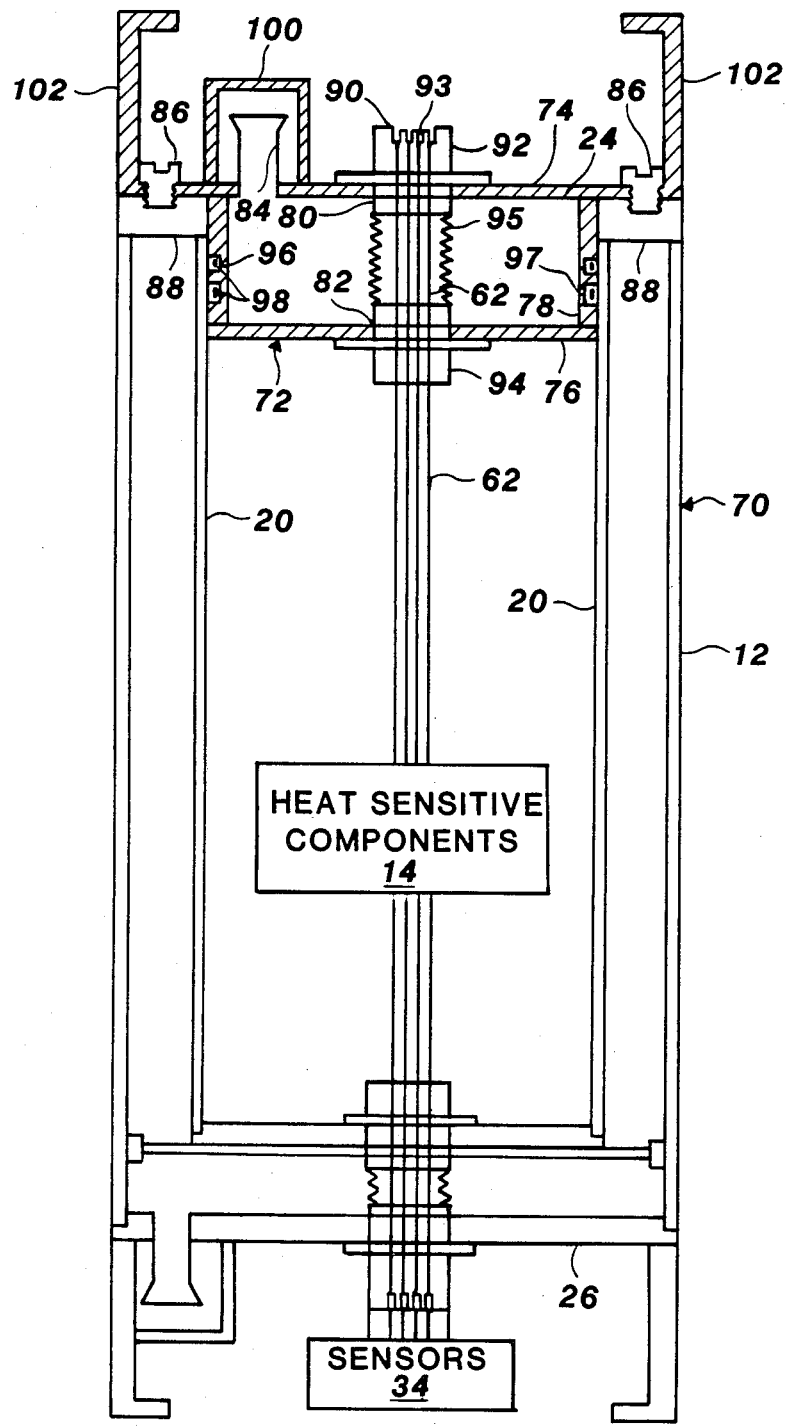
FIG. 3 shows a cross-sectional view of an embodiment of the invention similar to the embodiment shown in FIG. 2, but with an evacuated chamber instead of a plug.

Reference is now made to FIG. 3 which shows a cross-sectional view of another embodiment of the invention. The apparatus 70, shown in FIG. 3, includes the same elements at the bottom end 26 of Dewar 12, shown in FIG. 2, and also includes additional elements shown at the top end 24. It will be apparent to those skilled in the art that the additional elements shown in FIG. 3 can be used with, as shown, or without the elements shown in FIG. 2.

An evacuated chamber 72 is disposed in top end 24. Chamber 72 has a top wall 74, a bottom wall 76 and a side wall 78. Side wall 78 sealably engages inside wall 20 of Dewar 12. Chamber 72 is evacuated to eliminate thermal convection thereby reducing heat transfer between top wall 74 and bottom wall 76. This reduction in heat transfer improves the thermal protection provided for heat sensitive components 14. Top wall 74 has portions defining a top wall aperture 80. Bottom wall 76 has portions defining a bottom wall aperture 82. A second pinch-off tube 84 is used to evacuate chamber 72. Chamber 72 is removably connected to Dewar 12 by screws 86, two of which are shown. Screws 86 engage a flange 88.

A top connector 90 has a first component 92 and a second component 94. First component 92 sealably engages top wall aperture 80 and second component 94 sealably engages bottom wall aperture 82. First component 92 is connected by conduction elements 62 to second component 94. Second component 94 is connected by conduction elements 62 to heat sensitive components 14. Conduction elements 62 can be optical fibers or electrically conducting wires.

If the portions of conduction elements 62 connecting first component 92 to second component 94 are wires, they can be bare metal if high voltages are not employed. If high voltages or many close-lying wires are employed, the conduction elements 62 can be insulated, in which case a bellows 95 is used to surround conduction elements 62. The bellows 95 is necessary because many insulating materials have poor vacuum characteristics. If a bellows 95 is used, the contacts 93 of first component 92 need not be gas tight since the region inside of the bellows 95 is not evacuated. A bellows 95 made of corrugated metal is used instead of ordinary tubing to reduce stresses arising from expansion and contraction.

Chamber 72 can be cylindrical, as shown, and include O-ring grooves 96, 97 located at the outside of side wall 78. O-rings 98 is located in each groove 96, 97. The dimensions and tolerances of chamber 72 and the dimensions of the O-rings 98 are chosen to achieve a good seal between inside wall 20 and side wall 78. The seal prevents the circulation of air past chamber 72 and permits chamber 72 to be readily removed to allow access to heat sensitive components 14. A third protector 100 protects second pinch-off tube 84 and a fourth protector 102 protects first component 92 and second pinch-off tube 84.

The foregoing description of several embodiments of the invention has been presented for purposes of illustration and description. It is not intended to be exhaustive or to limit the invention to the precise forms disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for thermally protecting heat sensitive components of tools, said apparatus comprising:
    a. a Dewar holding the heat sensitive components, said Dewar having an open top end, a bottom end, an inside wall, and an outside wall, the inside wall being spaced apart from the outside wall, the inside wall having portions defining an inside wall aperture located at the bottom end of said Dewar, the outside wall having portions defining an outside wall aperture located at the bottom end of said Dewar;
    b. a plug adapted for passing elements suitable for powering, controlling, and monitoring the heat sensitive components and elements such that data collected or generated from the heat sensitive components may be transmitted outside of said Dewar, said plug being located in the top end, and substantially closing the top end such that a thermal seal is provided for the open end of said Dewar; and
    c. a bottom connector having inside and outside components, the inside component being operatively connected to the outside component and to the heat sensitive components, the inside component sealably engaging the inside wall aperture, the outside component sealably engaging the outside wall aperture.

2. The apparatus of claim 1 wherein said inside and outside components are connected by optical fibers.

3. The apparatus of claim 2 further comprising a bellows surrounding said optical fibers, said bellows being sealably connected to said inside and outside components.

4. The apparatus of claim 2 wherein said inside component is connected to the heat sensitive components by optical fibers.

5. The apparatus of claim 1 wherein said inside and outside components are connected by electrically conducting wires.

6. The apparatus of claim 5 further comprising a bellows surrounding said wires, said bellows being sealably connected to said inside and outside components.

7. The apparatus of claim 5 wherein said inside component is connected to the heat sensitive components by electrically conducting wires.

8. An apparatus for thermally protecting heat sensitive components of tools, said apparatus comprising:
    a. a Dewar holding the heat sensitive components, said Dewar having an open top end, a bottom end, an inside wall and an outside wall, the inside wall being spaced apart from the outside wall, wherein said Dewar inside wall has portions defining an inside wall aperture located at the bottom end of said Dewar, and wherein the outside wall of said Dewar has portions defining an outside wall aperture located at the bottom end of said Dewar, said apparatus further comprising a bottom connector having inside and outside components, said inside component sealably engaging the inside wall aperture, said outside component sealably engaging the outside wall aperture, wherein said inside component is operatively connected to said outside component and to the heat sensitive components;
    b. an evacuated chamber disposed in the top end for providing a thermal seal to the top end of said Dewar, said chamber having a top wall, a bottom wall and a side wall, the side wall sealably engaging the inside wall of said Dewar, the top wall having portions defining a top wall aperture, the bottom wall having portions defining a bottom wall aperture;
    c. a top connector having first and second components, the first component sealably engaging the top wall aperture, the second component sealably engaging the bottom wall aperture, said second component being operatively connected to said first component and to the heat sensitive components; and
    d. means removably connecting said chamber to said Dewar.

9. The apparatus of claim 8 wherein said chamber comprises a cylinder.

10. The apparatus of claim 8 wherein said chamber side wall includes portions defining a groove.

11. The apparatus of claim 10 further comprising an O-ring, said O-ring being disposed in said groove.

12. The apparatus of claim 8 further comprising a pinch-off tube for evacuating said chamber, said pinch-off tube being connected to said chamber.

13. The apparatus of claim 8 wherein said first and second components are connected by optical fibers.

14. The apparatus of claim 13 wherein said second component is connected to the heat sensitive components by optical fibers.

15. The apparatus of claim 8 wherein said first and second components are connected by electrically conducting wires.

16. The apparatus of claim 15 further comprising a bellows surrounding said wires, said bellows being sealably connected to said first and second components.

17. The apparatus of claim 15 wherein said second component is connected to the heat sensitive components by electrically conducting wires.

* * * * *